(12) United States Patent
Takashima et al.

(10) Patent No.: US 11,531,270 B2
(45) Date of Patent: Dec. 20, 2022

(54) FAST FABRICATION OF POLYMER OUT-OF-PLANE OPTICAL COUPLER BY GRAY-SCALE LITHOGRAPHY

(71) Applicant: Arizona Board of Regents on Behalf of the University of Arizona, Tucson, AZ (US)

(72) Inventors: Yuzuru Takashima, Tucson, AZ (US); Christopher R. Summitt, Tucson, AZ (US); Sunglin Wang, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 117 days.

(21) Appl. No.: 16/629,130

(22) PCT Filed: Jul. 9, 2018

(86) PCT No.: PCT/US2018/041314
§ 371 (c)(1),
(2) Date: Jan. 7, 2020

(87) PCT Pub. No.: WO2019/010495
PCT Pub. Date: Jan. 10, 2019

(65) Prior Publication Data
US 2020/0292943 A1    Sep. 17, 2020

Related U.S. Application Data

(60) Provisional application No. 62/532,925, filed on Jul. 14, 2017, provisional application No. 62/530,071, filed on Jul. 7, 2017.

(51) Int. Cl.
*G02B 6/42* (2006.01)
*G03F 7/20* (2006.01)
(Continued)

(52) U.S. Cl.
CPC ......... *G03F 7/2008* (2013.01); *G02B 6/4214* (2013.01); *G03F 1/42* (2013.01);
(Continued)

(58) Field of Classification Search
CPC ...... G03F 7/2008; G03F 7/0005; G03F 7/039; G03F 7/094; G03F 7/2022; G03F 7/2053; G03F 7/26; G02B 6/4214
See application file for complete search history.

(56) References Cited

U.S. PATENT DOCUMENTS 4,152,726 A * 5/1979 Kojima ................. G11B 3/702
369/126
4,655,876 A * 4/1987 Kawai .................... G11B 7/261
430/323
(Continued)

FOREIGN PATENT DOCUMENTS

| JP | 62-124510 | * | 6/1987 |
| JP | 2007-232840 | * | 9/2007 |
| JP | 2014-072489 | * | 4/2014 |

OTHER PUBLICATIONS

Berker et al., "Dual-polarity, single resist mixed (E-beam/photo) lithography" IEEE Electron. Device Lett. vol. EDL-2(11) pp. 281-284 (Nov. 1981).*
(Continued)

*Primary Examiner* — Martin J Angebranndt
(74) *Attorney, Agent, or Firm* — Mayer & Williams, PC; Stuart Mayer

(57) ABSTRACT

A lithographic method for making an out-of-plane optical coupler includes forming a photoresist layer of positive photoresist material over a substrate. The positive photoresist layer undergoes a flood exposure to light through a binary mask to pattern a latent image of a mirror blank in the photoresist layer. A laser beam is scanned over the latent image of the mirror blank to apply controlled dosages of
(Continued)

light at specified locations to form a latent image of a planar mirror surface that is oriented at a prescribed non-zero angle to a plane in which the substrate extends. The positive photoresist material is developed so that a remaining portion of the developed positive photoresist material forms an out-of-plane optical coupler having a planar mirror surface that is oriented at the prescribed angle.

10 Claims, 18 Drawing Sheets

(51) Int. Cl.
*G03F 7/039* (2006.01)
*G03F 7/09* (2006.01)
*G03F 7/26* (2006.01)
*G03F 1/42* (2012.01)
*G03F 7/00* (2006.01)

(52) U.S. Cl.
CPC ............ *G03F 7/0005* (2013.01); *G03F 7/039* (2013.01); *G03F 7/094* (2013.01); *G03F 7/2022* (2013.01); *G03F 7/2053* (2013.01); *G03F 7/26* (2013.01)

(56) References Cited

U.S. PATENT DOCUMENTS

| | | | | |
|---|---|---|---|---|
| 6,436,607 B1* | 8/2002 | Lozes | ................. | H01J 37/3026 430/296 |
| 6,730,256 B1* | 5/2004 | Bloomstein | ............. | B29C 64/40 264/401 |
| 7,955,786 B2* | 6/2011 | Sumioka | ................. | G11B 7/263 430/320 |
| 2004/0037487 A1* | 2/2004 | Nakaya | ............... | G03F 7/70291 385/14 |
| 2005/0232130 A1* | 10/2005 | Oyake | .................... | G11B 7/261 |
| 2006/0246378 A1* | 11/2006 | Neijzen | ..................... | G03F 7/30 430/311 |
| 2009/0074353 A1* | 3/2009 | Yanagisawa | ......... | H05K 1/0274 385/14 |
| 2009/0080846 A1 | 3/2009 | Shao | | |
| 2010/0099035 A1 | 4/2010 | Sandstrom | | |
| 2010/0141729 A1* | 6/2010 | Petsch | .................... | G02C 7/021 347/225 |
| 2010/0209857 A1* | 8/2010 | Martinez | ............. | G03F 7/70383 430/322 |

OTHER PUBLICATIONS

Summitt et al., "Process optimization for a 3D optical coupler and waveguide fabrication on a single substrate using buffer coat material." SPIE, 2015, pp. 937415-1-937415-6.

Summitt et al., Micro-optics fabrication by maskbased and maskless mixed lithography process towards 3D optical circuits. SPIE, 2014, pp. 89740C-1-89740C-6.

Summitt, "Fast fabrication of polymer out-of-plane optical coupler by gray-scale lithography." Optics Express vol. 25, No. 15, Jul. 24, 2017, pp. 17960-17970.

Gan et al., "Programmed resist sidewall profiles using sub-resolution binary grayscale masks for Si-photonics applications." BACUS News vol. 28, No. 6, Jun. 2012, pp. 1-15.

* cited by examiner

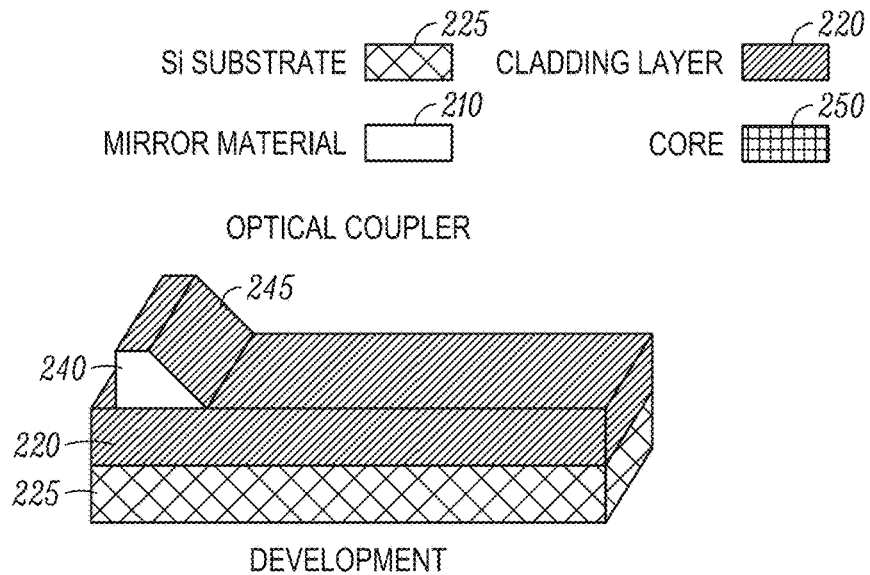
OPTICAL COUPLER
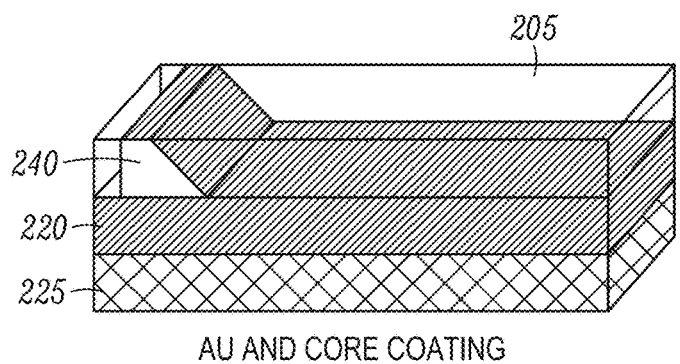
DEVELOPMENT
*FIG. 2D*
AU AND CORE COATING
*FIG. 2E*
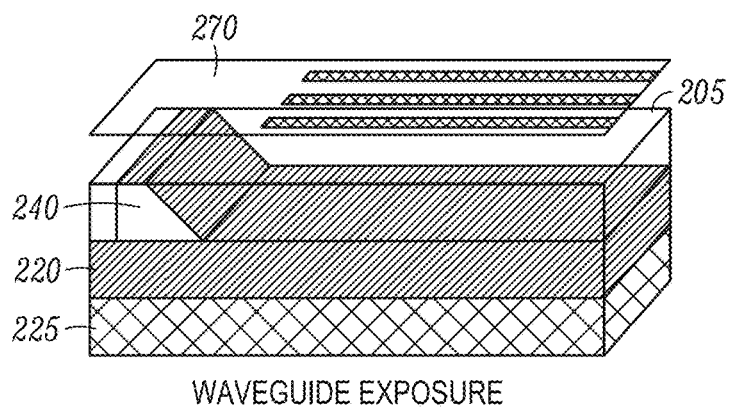
WAVEGUIDE EXPOSURE
*FIG. 2F*

L = 8μM

L = 9μm

D=798mJ/Cm²

D=1140mJ/Cm²

CORRECT ALIGNMENT

INCORRECT ALIGNMENT

FAST FABRICATION OF POLYMER OUT-OF-PLANE OPTICAL COUPLER BY GRAY-SCALE LITHOGRAPHY

BACKGROUND

The scalability in data transfer rate and wiring density of metallic wire is facing physical limitations imposed by increased clock frequency. Planar and integrated optical interconnects with lasers, waveguides, modulators, detectors, and dispersive devices for wavelength division multiplexing are expected to pace with the rapidly increasing demand for high speed, high density data transmission. While such complete integration is the most ideal embodiment, an out-of-plane optical coupler is a viable solution for semi-integrated optical interconnects for which external light sources are employed. It provides a low cost yet moderately dense optical interconnect by leveraging flip-chip mounting technology which enables discrete integration of light sources and detectors to a planar photonic circuit, for example, coupling of light between Vertical Cavity Surface-Emitting Lasers (VCSELs), waveguides, and photodiodes via micro lenses [5,6] and optical interfaces such as OptoBump.

Such out-of-plane coupling at a 90 degree angle, has been demonstrated by using diffraction gratings, evanescent couplers, and embedded mirrors. Diffraction gratings are designed for specific wavelengths, thus fabrication tolerance is tight in general, though they have high coupling efficiency. For evanescent couplers, a precise control of the fabrication process is needed due to the exponentially decreasing coupling efficiency as the separation from the waveguide increases. In contrast, embedded mirrors have less of a limitation in wavelength, provided the mirror surface is precisely fabricated along with controlling mirror angle.

Fabrication methods of mirror-based couplers have been reported for standalone mirrors by oblique exposure, and embedding a coupler directly into the waveguide by mechanically cutting the edge of the waveguide, as well as wet etching processes of Si substrates. Although the processes provide small coupling loss ranging from 0.35-4 dB, a lithographic process which has an affinity to the existing process and a yield which keeps up with established processes is highly desired for a streamlined integration of mirror fabrication into the device.

The laser direct writing, or gray scale lithography has been adopted to fabricate blazed gratings and tapered waveguides for mode matching and has a fast exposure rate, typically 100 mm$^2$/sec. A high exposure rate is assured when the characteristic length scale of the structure is large compared to the spot size, defined by $\lambda$/NA, where $\lambda$, is the wavelength of the laser and NA is the numerical aperture of the laser direct writing tool. In contrast, for a smaller structure whose length scale is comparable to the wavelength, the write resolution has to be increased by decreasing the focal volume to ensure that a high quality optical quality surface is obtained. Thus, laser direct writing has flexibility in terms of writing speed, area, aspect ratio and resolution.

BRIEF DESCRIPTION OF THE DRAWINGS

FIGS. 2(a)-2(h) show one example of an overall process flow that may be employed to fabricate the optical interconnect arrangement shown in FIG. 1.

SUMMARY

In accordance with one aspect of the subject matter described herein, a lithographic method for making an out-of-plane optical coupler includes forming a photoresist layer of positive photoresist material over a substrate. the positive photoresist layer undergoes a flood exposure to light through a binary mask to pattern a latent image of a mirror blank in the photoresist layer. A laser beam is scanned over the latent image of the mirror blank to apply controlled dosages of light at specified locations to form a latent image of a planar mirror surface that is oriented at a prescribed non-zero angle to a plane in which the substrate extends. The positive photoresist material is developed so that a remaining portion of the developed positive photoresist material forms an out-of-plane optical coupler having a planar mirror surface that is oriented at the prescribed angle.

In accordance with one aspect of the subject matter described herein, a method for making an optically reflective planar surface on a structure includes forming a latent image of a mirror blank in a photoresist layer using a first lithographic technique. A latent image of the structure is formed in a region defined by the latent image of the mirror blank using a second lithographic technique different from the first lithographic technique such that after development of the photoresist layer a remaining portion of the photoresist layer defines the structure. The structure has a planar surface that is oriented at a prescribed non-zero angle to a plane in which the substrate extends. The photoresist layer is developed and an optically reflective coating is selectively applied onto the planar surface.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DETAILED DESCRIPTION

Figure 1:
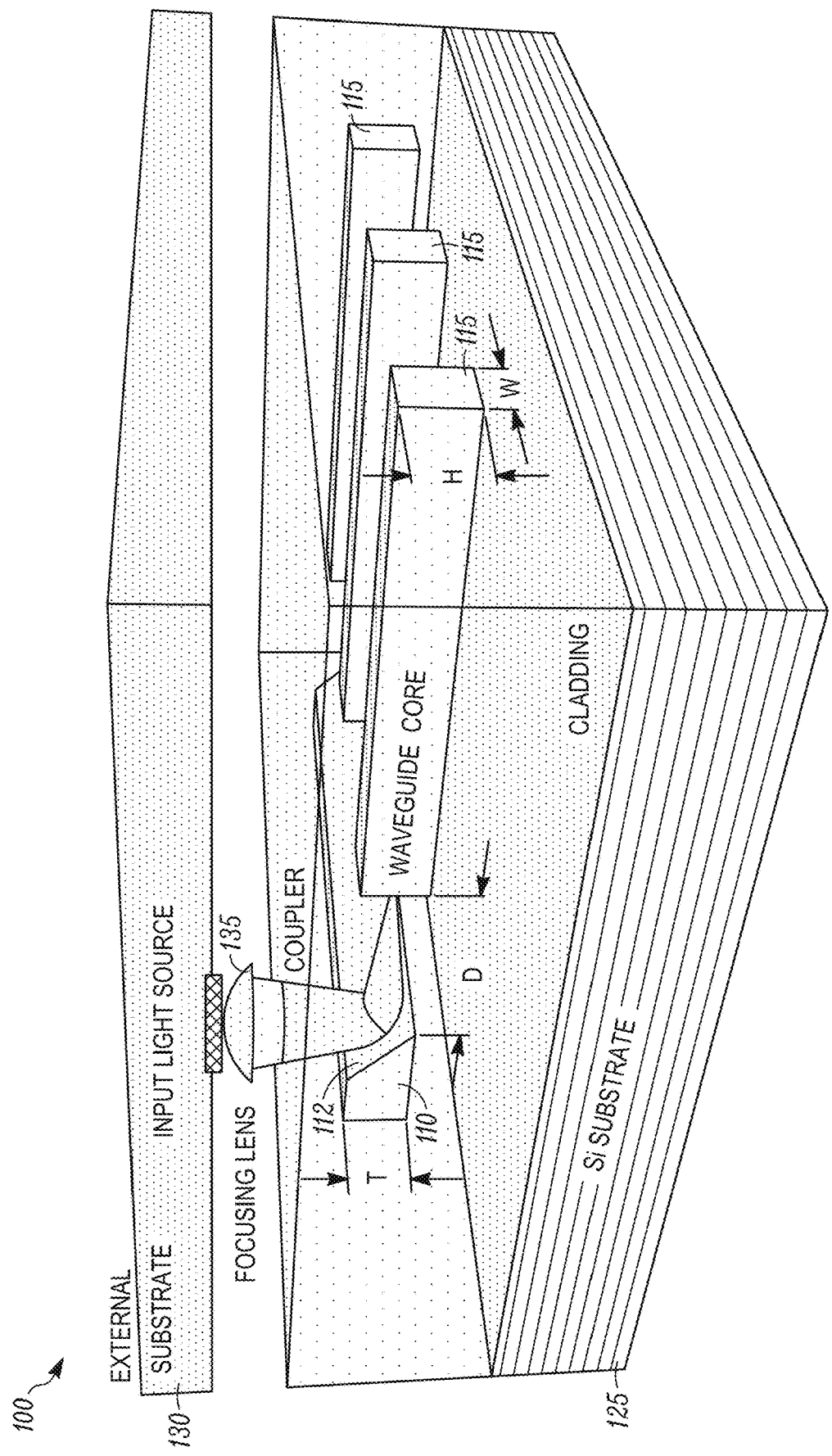
FIG. 1 shows a perspective view of one example of an optical interconnect arrangement.

FIG. 1 shows a perspective view of one example of an optical interconnect arrangement 100. The arrangement 100 includes an out-of-plane optical coupler 110 having a mirror surface 112 that receives light from an external source and reflects the light to one more planar waveguide cores 115. The out-of-plane coupler 110 and the waveguide core(s) 115 are disposed in a surrounding cladding layer 120, that is itself formed located on a substrate 125. The mirror surface 112 is oriented at an acute angle (e.g., a 45° angle) with respect to the plane of the substrate 125 so that light received from a direction out of the plane of the substrate 125 is received by the mirror surface 112 of the coupler 110 and reflected to the waveguide core(s) 115. As shown in FIG. 1 an external light source(s) 130, such as a VCSEL, for example, which may include an integrated micro lens array 135, directs the light to the optical coupler 110.

The optical coupler 110 has a height T and the planar waveguides core(s) 115 have dimensions of (w)×(h). The distance from the optical coupler 110 to the waveguide core(s) 115 is d. In one particular embodiment, the dimensions T, d, h, and w may be determined as follows.

A typical index contrast $\Delta=(n_{core}^2-n_{clad}^2/(2n_{core}^2)$ of polymer waveguides is on the order of 0.01, which gives rise to the NA of the waveguide, $NA=\sqrt{(n_{core}^2-n_{clad}^2)}=0.1$. In some embodiments the height of the mirror T and the spacing d between the edge of the waveguide and the surface of the mirror may be designed to avoid beam clip-off at the mirror surface. The condition for avoiding clip-off is given by.

$$T \geq w_0\left[1+\left(\frac{d}{z_R}\right)^2\right]^{1/2} \approx w_0 \quad (1)$$

where $Z_R=w_0/NA$ is the Rayleigh range, and $w_0$ is the diameter of the beam waist. The $2^{nd}$ term of Eq. (1) may be further simplified as $T \approx w_0$, since it is possible to fabricate a waveguide having a dimension d<5 µm, and because the Rayleigh range for an NA=0.1 beam is about 25 µm, the divergence of the beam at the surface of the mirror is negligible. The cross-sectional dimensions of the waveguide may be determined by a mode solver package so that the waveguide supports a single mode.

Figure 2A:
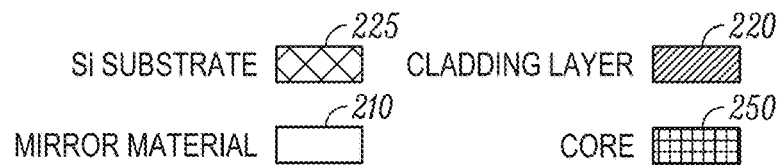
Figure 2A:
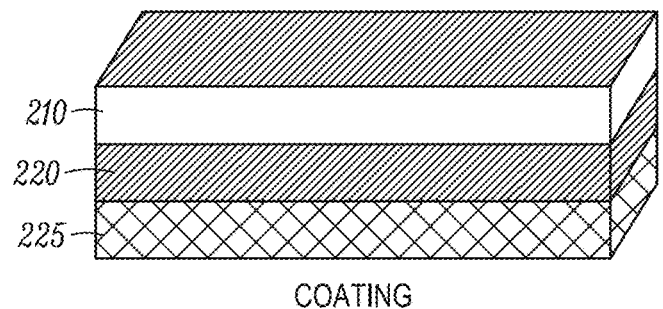
Figure 2B:
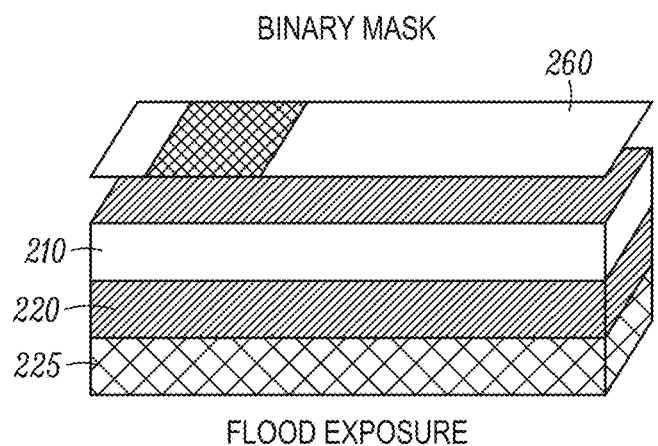

FIGS. 2(a)-2(h) shows one example of an overall process flow that may be employed to fabricate the optical interconnect arrangement shown in FIG. 1. In FIG. 2(a) a lower cladding layer 220 is formed on a substrate 225 by e.g., spin coating. Next, in FIG. 2(b) a positive photoresist layer 210 in which the optical coupler will be defined is formed on the cladding layer 220. As further shown in FIG. 2(b) a binary mask 260 is used to pattern a mirror blank in accordance with a photolithographic technique. The positive photoresist layer 210 undergoes a flood exposure with the binary mask in place to form a latent image of a mirror blank that will define the reflective surface of the optical coupler.

Figure 2C:
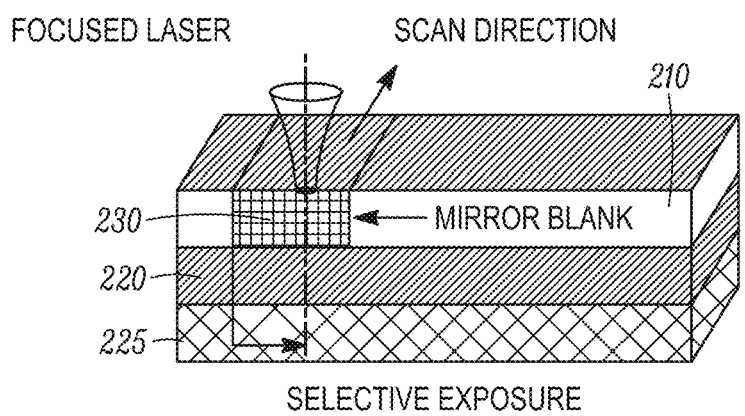

As indicated in FIG. 2(c), once the latent image of the mirror blank 230 has been formed, a scanning laser is used in a direct laser writing process to form the mirror surface of the optical coupler at the desired angle with respect to the plane of the structure. As will be explained in more detail below, the scanning laser exposes the mirror blank by scanning in the x-direction and applying a suitable exposure dosage so that after development of the positive photoresist the remaining material defines the optical coupler. After completion of the direct writing process the positive photoresist is developed to remove the exposed photoresist material and thereby define the optical coupler 240 with the mirror surface 245, as shown in FIG. 2(d).

After formation of the optical coupler 240, an optically reflective coating (e.g., Au) is selectively applied to the mirror surface 245 using a technique such as lithographic wet etching. As shown in FIG. 2(e), a second photoresist layer 205 suitable for forming the waveguide core(s) is applied over the optical coupler and the exposed cladding layer 220. The second photoresist layer 205 is exposed through a mask 270 to pattern the waveguide core(s) in FIG. 2(f) and the waveguide core(s) 250 are developed in step 2(g). Finally, an upper cladding layer 280 is formed over the optical coupler and waveguide core(s) as shown in FIG. 2(h).

In one illustrative embodiment of the optical interconnect arrangement that serves as a test sample, the formation of which will be discussed in more detail below, the cladding layer 220 was an 11 µm thick layer of Epoclad (Microresist Technology, Berlin, Germany) that was spin coated onto a 500 µm silicon substrate preconditioned by an adhesion promoter HDMS. The cladding layer underwent a flood exposure (350 mJ/cm² at 365 nm) using a model MA6 mask aligner (Suss Microtec, Germany), development (90 sec bath, SU-8 developer) and hard bake (90° C. for 5 min on a hot plate). Following the hard bake, an 8 µm layer of positive photoresist, WPR-5100 (JSR, Sunnyvale, Calif.), was spin coated (300 0 rpm for 55 sec) onto the cladding layer. Although, the final coupler height was 5.5 µm, an 8 µm layer of resist was used during processing to accommodate a loss of 2-3 µm of mirror height during the development process. The positive photoresist underwent a flood exposure (250 mJ/cm² at 365 nm) to pattern a latent image of the mirror blank with a width of 13 µm.

Figure 3:
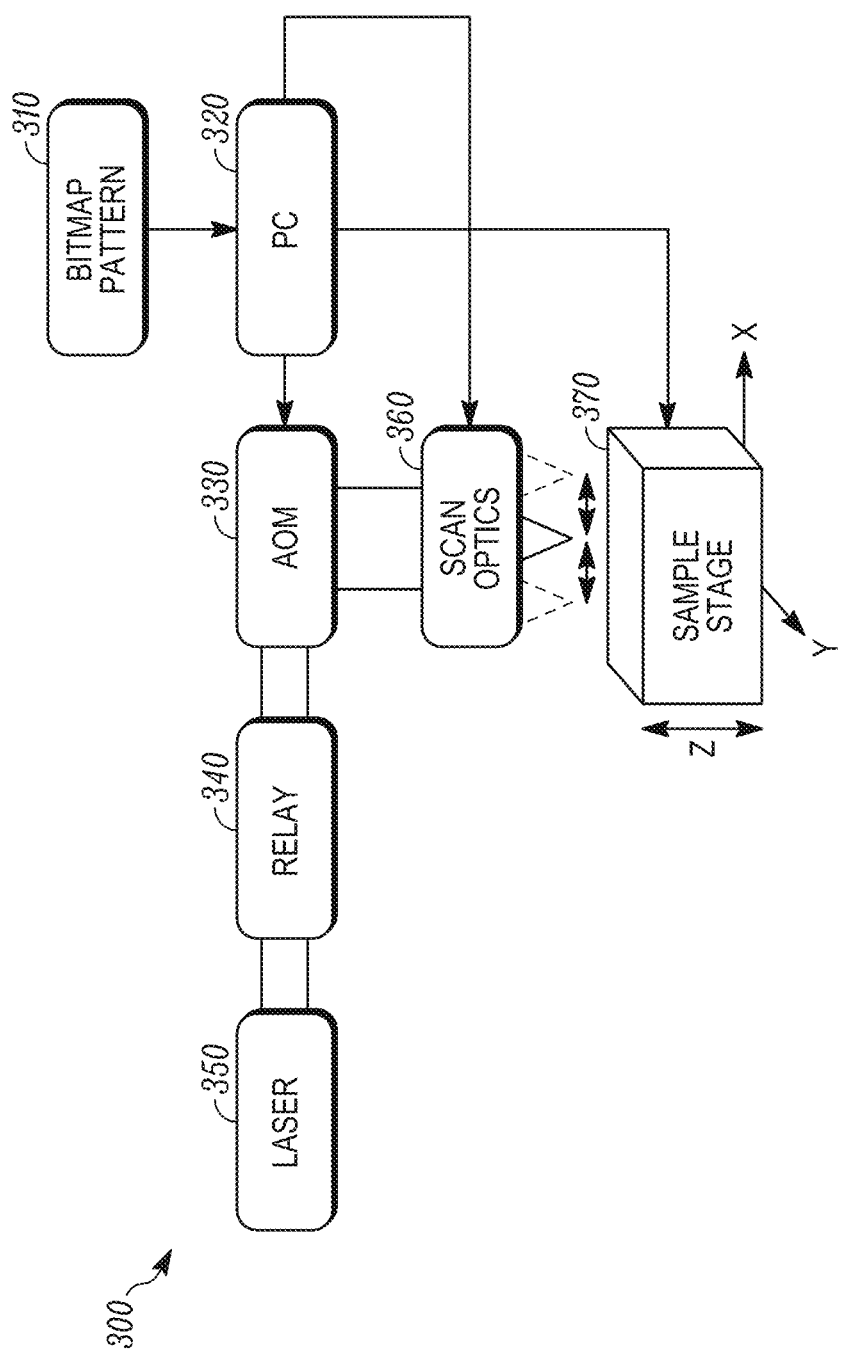
FIG. 3 shows a schematic diagram of one example of a maskless lithography tool (MLT).

As previously mentioned, after forming the latent image of the mirror blank, the mirror surface with the proper orientation may be fabricated using maskless lithography. A schematic diagram of one example of a suitable maskless lithography tool (MLT) 300 is shown in FIG. 3. The MLT 300 uses a flying spot scanning laser system to apply exposure patterns using an 8-bit (0-255) grayscale. The grayscale level in the bitmap file 310 corresponds to the modulation of laser power, which is controlled by an Acoustic Optical Modulator (AOM) 320. The laser 350 is expanded (not shown), and relayed to the AOM 320 by relay optics 340. The scan optics 360 employ a one-dimensional scan along the x-direction while the sample stage 370 synchronously moves along y-direction. All the components may be controlled by a processor such as a personal computer (PC) 320. This particular MLT 300 operates at a wavelength of 365 nm with a typical continuous laser power of 450 mW.

Figure 4A:
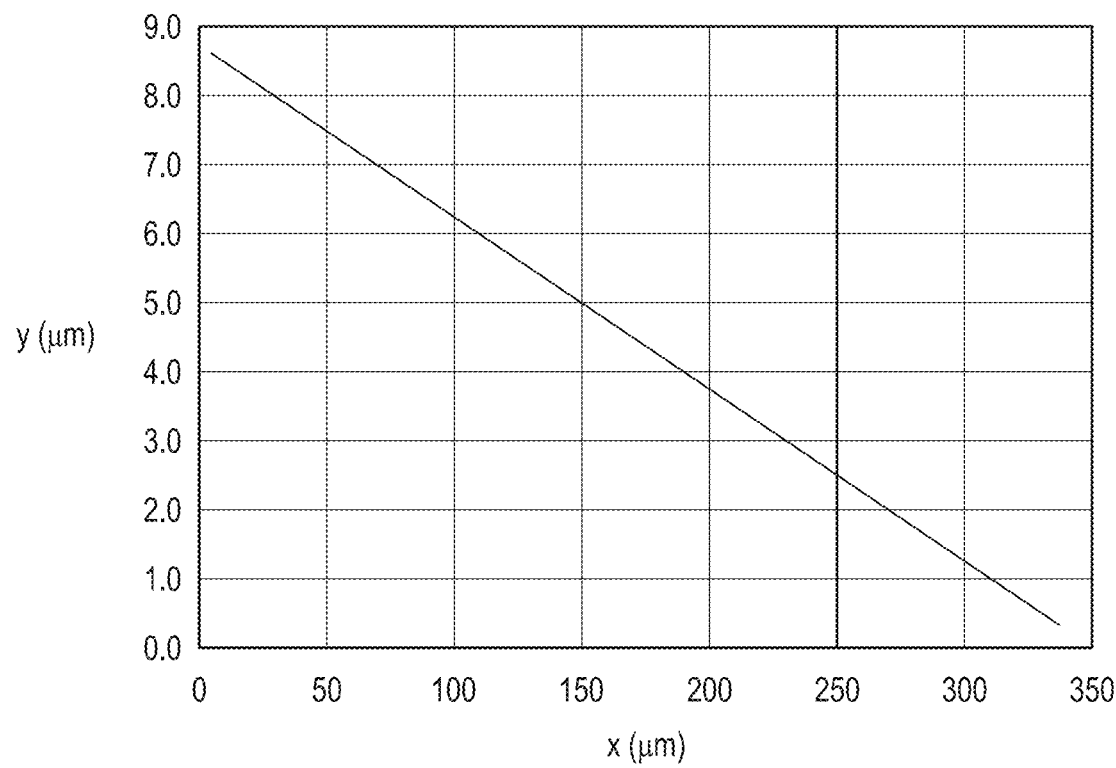
FIG. 4(a) shows the dosage applied to a layer of resist extending over a distance of 350 μm.
Figure 4B:
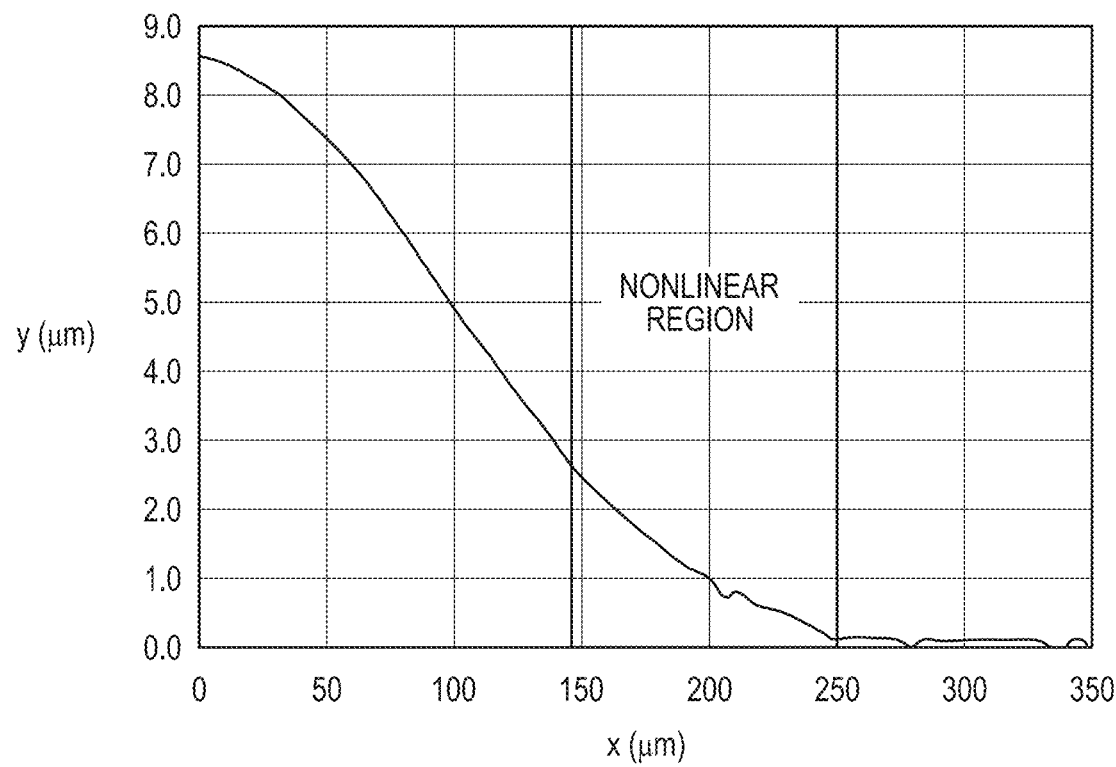
FIG. 4(b) shows the resist topology after removal of the exposed resist by a development process.

The formation of a mirror surface that is both flat and oriented at the proper angle (e.g., 45°) is controlled by both the location of the scanning laser beam and the dosage of laser power to which the photoresist is exposed. It is important to note that two nonlinear factors are involved. First, the response of the resist to dosage is non-linear. This is illustrated with reference to FIGS. 4(a) and 4(b). FIG. 4(a) shows the dosage applied to a layer of resist extending over a distance of 350 μm. The dosage decreases linearly from one end of the layer to the other. FIG. 4(b) shows the resist topology after removal of the exposed resist by a development process. As the figures demonstrate, the removal rate of the resist material increases as the dose decreases. At the dose levels that are employed, there clearly is a region (from about 150 μm to 250 μm) in FIG. 4(b) where the removal rate of resist material responds in a nonlinear manner to the applied dosage.

Figure 4C:
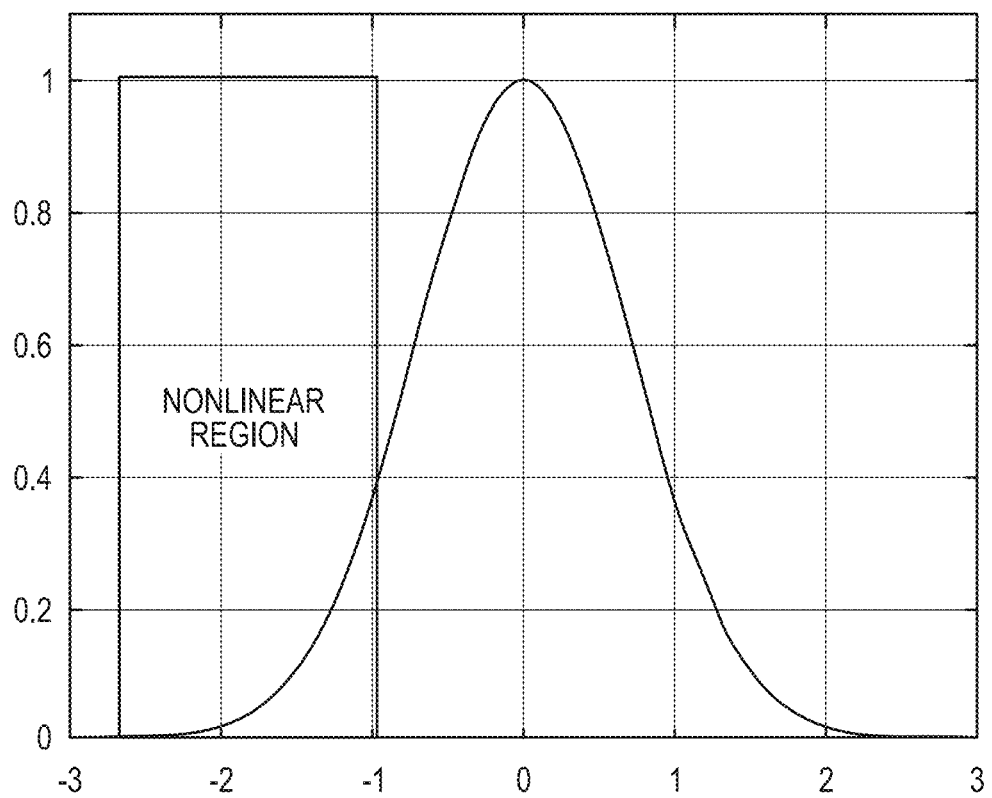
FIG. 4(c) show the Gaussian intensity profile of the laser used in the MLT.

The second nonlinear factor that is involved in the formation of the mirror surface is the intensity profile of the laser beam that applies the dose. As shown in FIG. 4(c), the laser intensity has a Gaussian profile. In applying the laser beam to the resist, one side of the laser intensity profile was used where the slope of the profile is nonlinear. This nonlinear region is indicated in FIG. 4(c) for a beam spot that has a width of 2.1 μm.

Those of ordinary skill in the art will recognize that the interplay of these two nonlinear factors can be used to determine a suitable laser scan pattern and dosage that is to be applied to the resist in order to achieve an optical coupler having a flat mirror surface oriented at any desired angle. One technique for determining a suitable or optimal scan pattern and dosage will be described below when forming the optical coupler shown in FIG. 1 with the various illustrative materials and dimensions presented above in connection with the aforementioned test sample. Once these exposure parameters have been determined, they may used when performing the direct writing process shown in the selective exposure step of FIG. 2(c).

Figure 5B:
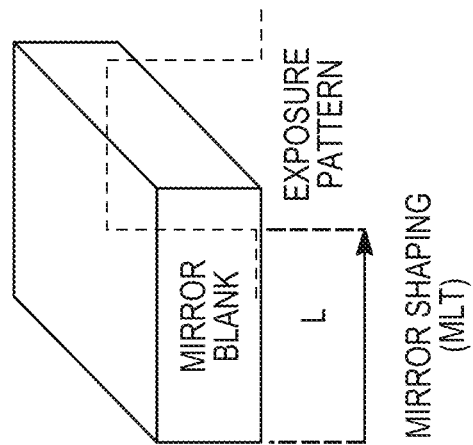
FIGS. 5(a) and 5(b) show a mirror blank that has been formed during a flood exposure step using a binary mask.
Figure 5A:
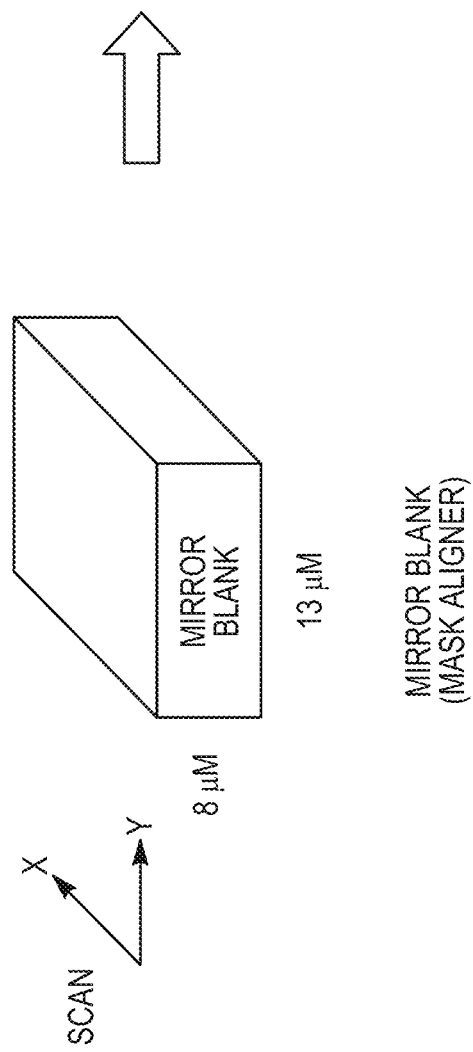

As discussed above and as further shown in FIG. 5(a), the mirror blank in the test sample has a width of 13 μm and the resist layer in which the mirror blank is formed has a depth or thickness of 8 μm. FIG. 5(a) also indicates the direction in which the laser beam is scanned.

Figure 6A:
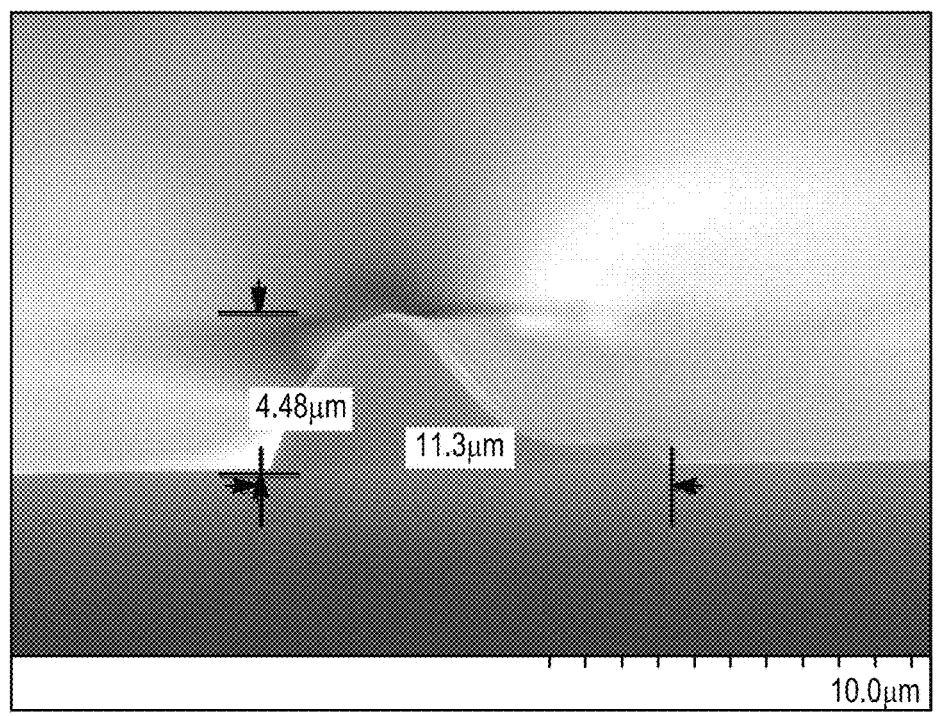
FIGS. 6(a)-6(d) show cross-sectional SEM images illustrating the mirror surface topology for four different samples when scanning the laser beam in a single dimension during the direct writing process at four different locations L.
Figure 6B:
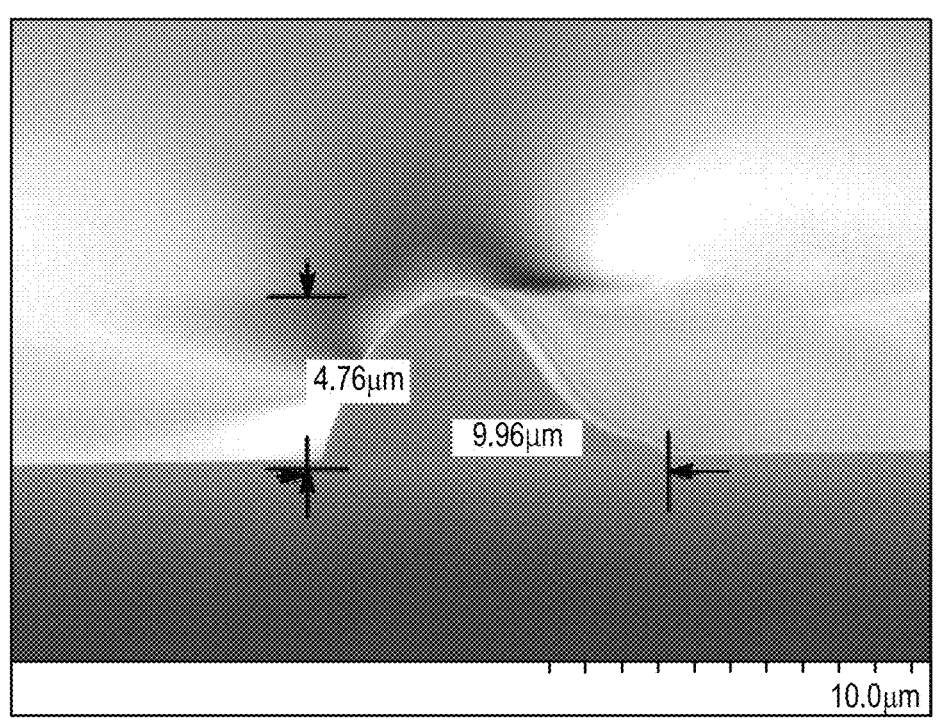
Figure 6C:
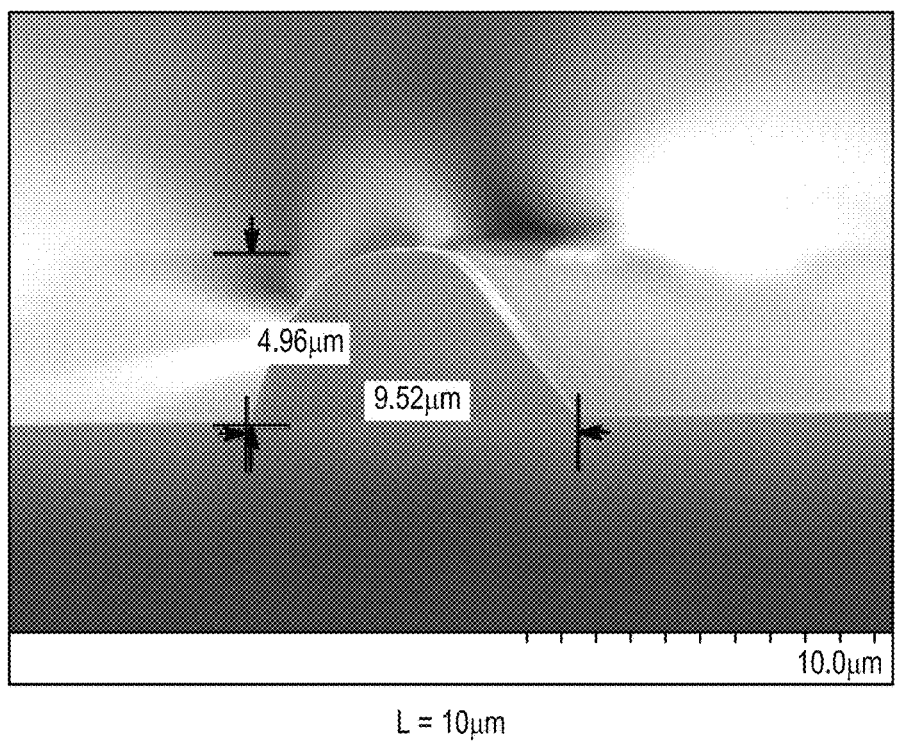
Figure 6D:
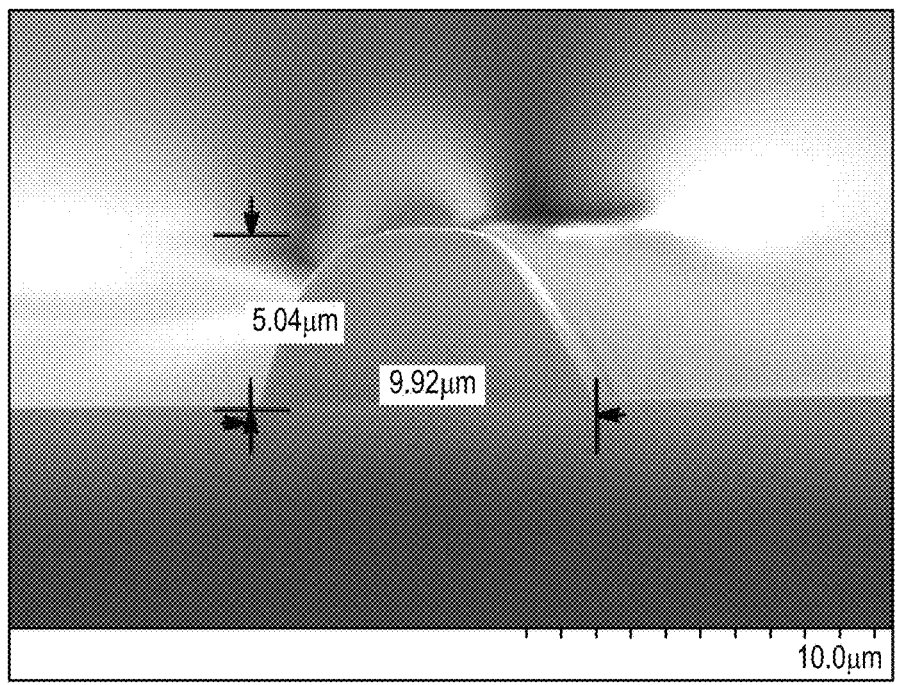
Figure 6E:
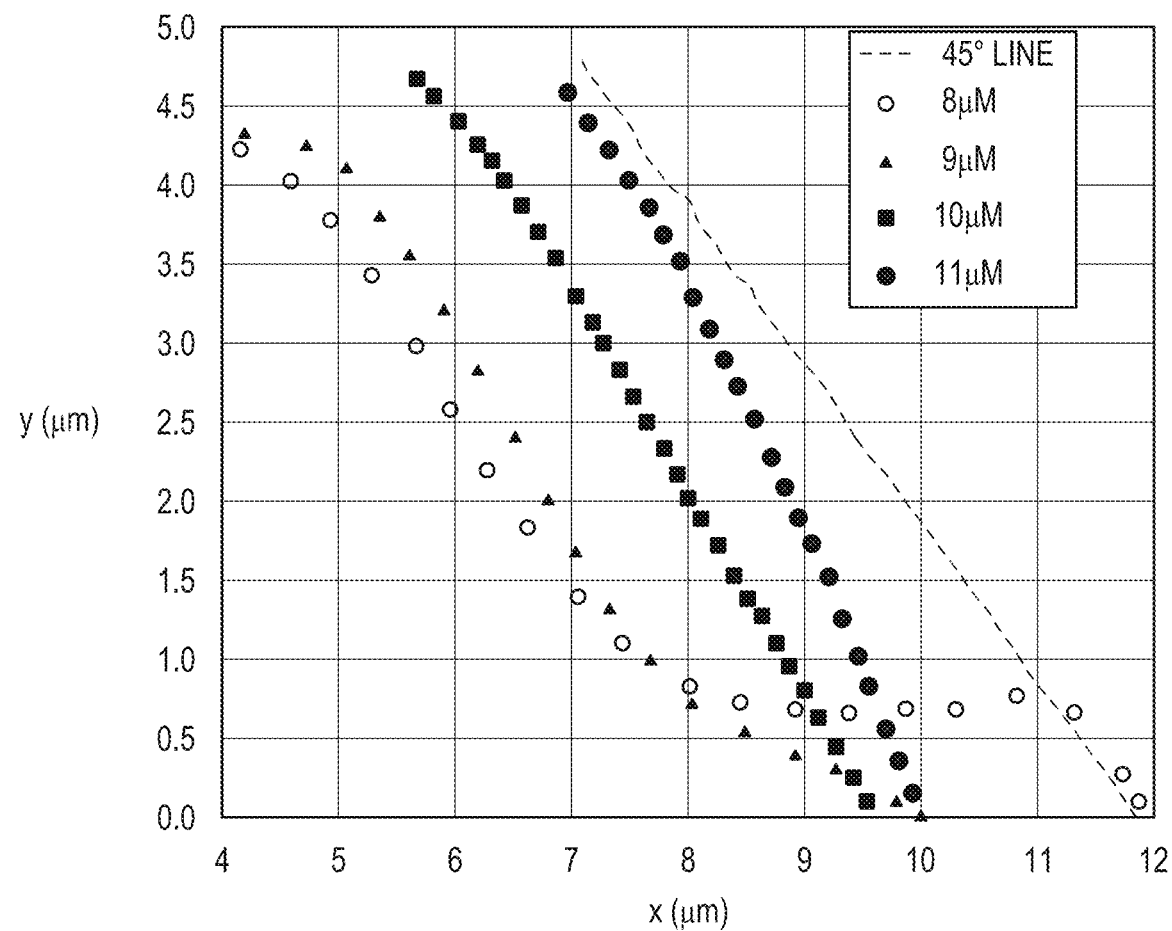
FIG. 6(e) is a plot of the surface topology for each sample.

To identify a suitable location L along which the laser beam is to be scanned, a number of different sacrificial mirror blank samples were fabricated and exposed by the scanning laser beam at different locations L. As indicated in FIG. 5(b), this location L is measured from the leftmost edge of the mirror blank. FIGS. 6(a)-6(d) show cross-sectional SEM images for four different samples. Each sample was exposed to the scanning beam at a different location L that was shifted to right from the previous sample. Specifically, the locations L are at 8 μm (FIG. 6a), 9 μm (FIG. 6b), 10 μm (FIG. 6c) and 11 μm. In each case the exposure dose remained the same (1140 mJ/cm²). Also indicated in the SEMs is the root-mean-square (RMS) error measured in waves (where λ=1.55 μm). The surface topology for each sample is plotted in FIG. 6(e), which also shows a straight 45° line as a reference. As is evident from the figures, the sample that exhibits the flattest surface is shown in FIG. 6(c) when the laser beam is scanned at the location L=10 μm. In contrast, the scans performed in FIGS. 6(a) and 6(b) are too close to the left edge of the mirror blank to yield a satisfactory surface, and the scan performed in FIG. 6(d) is too far from the left edge to yield a satisfactory surface.

While the surface topology that is produced in FIG. 6(c) is sufficiently flat, it is oriented at an angle of 54° and not the desired angle of 45°. To address this problem and reduce the angle another series of sacrificial mirror blanks were fabricated that were all scanned at the location L=10 μm, but with different dosages. The overall shape of the mirror blank was maintained by control of the dose D, which is given by:

$$D = \frac{NPw}{v}$$

where v is the beam speed, w is the beam spot size, P is the power density of the beam, and N is the number of repeated exposure scans. In this series of samples the parameters used were P=3.6×10⁶ w/cm², w=2.1×10⁻⁴ cm, and v=2×10³ cm/s.

Figure 7A:
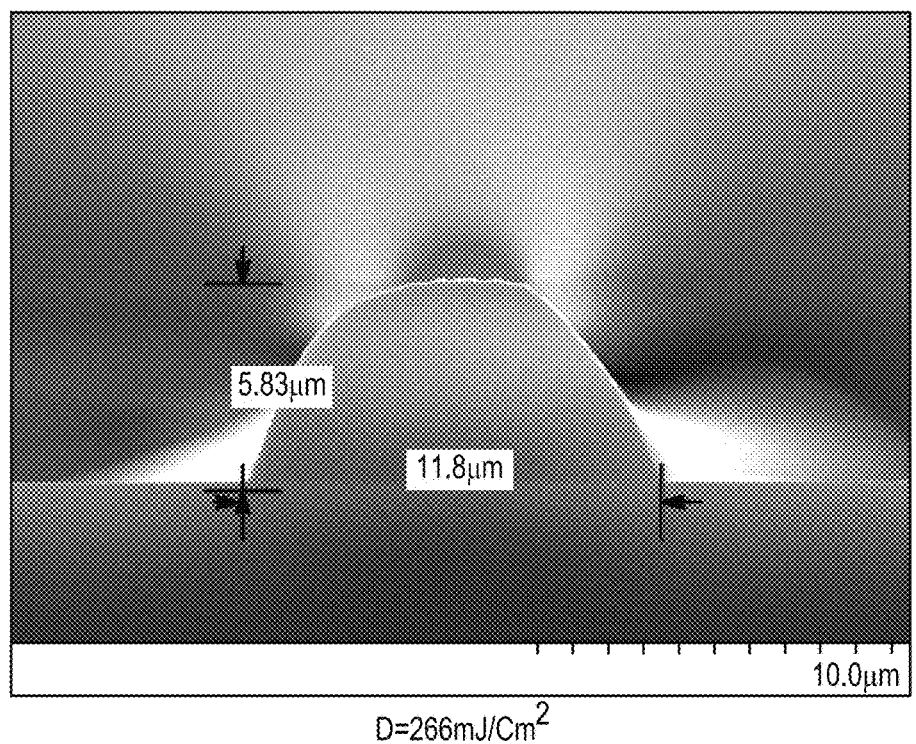
FIGS. 7(a)-7(d) show cross-sectional SEM images illustrating the mirror surface topology for four different samples when scanning the laser beam along the location shown in FIG. 6(c) with different dosages of light.
Figure 7B:
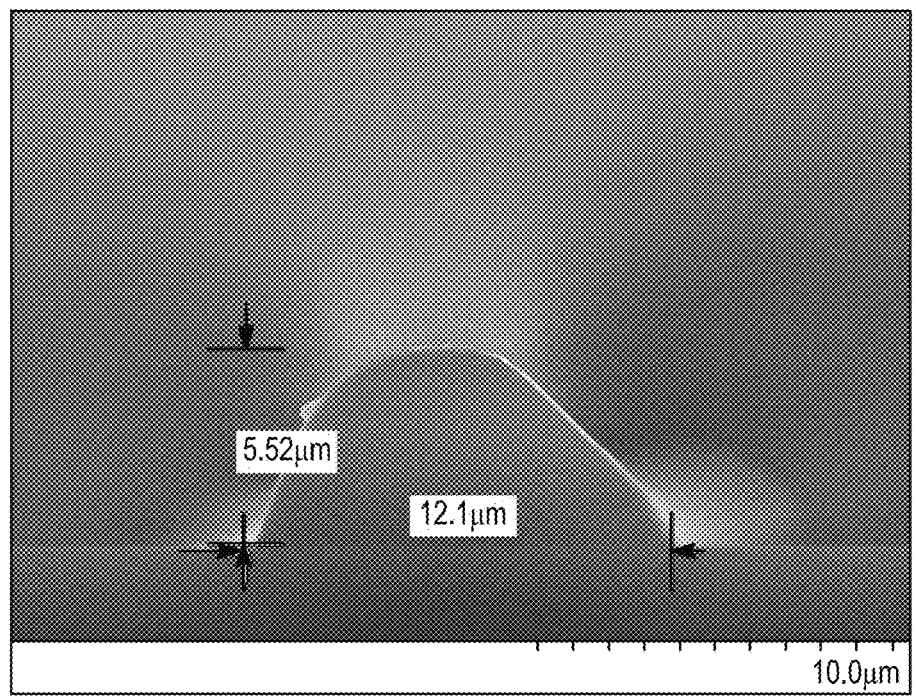
Figure 7C:
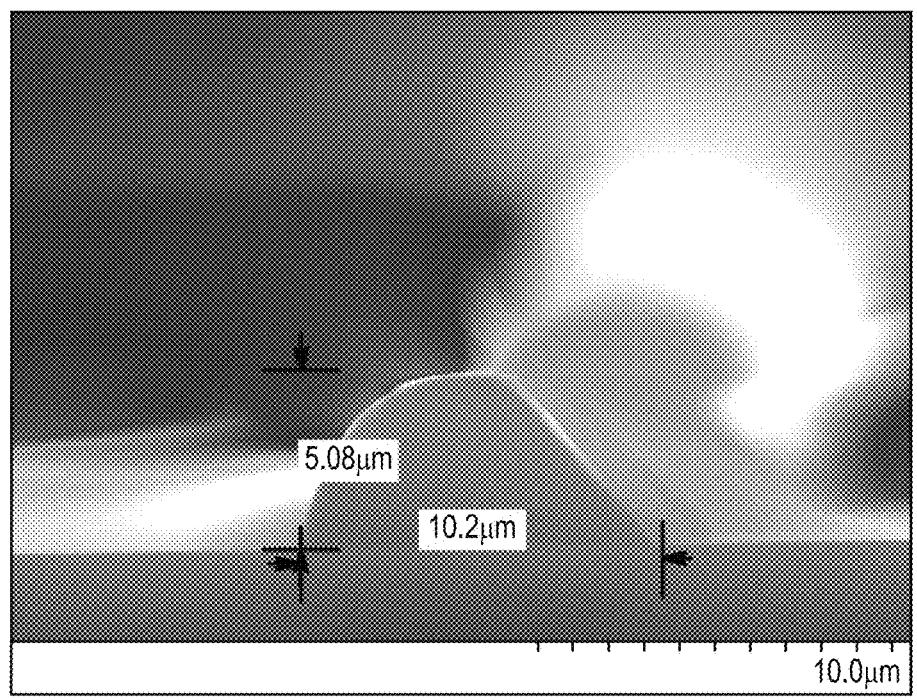
Figure 7D:
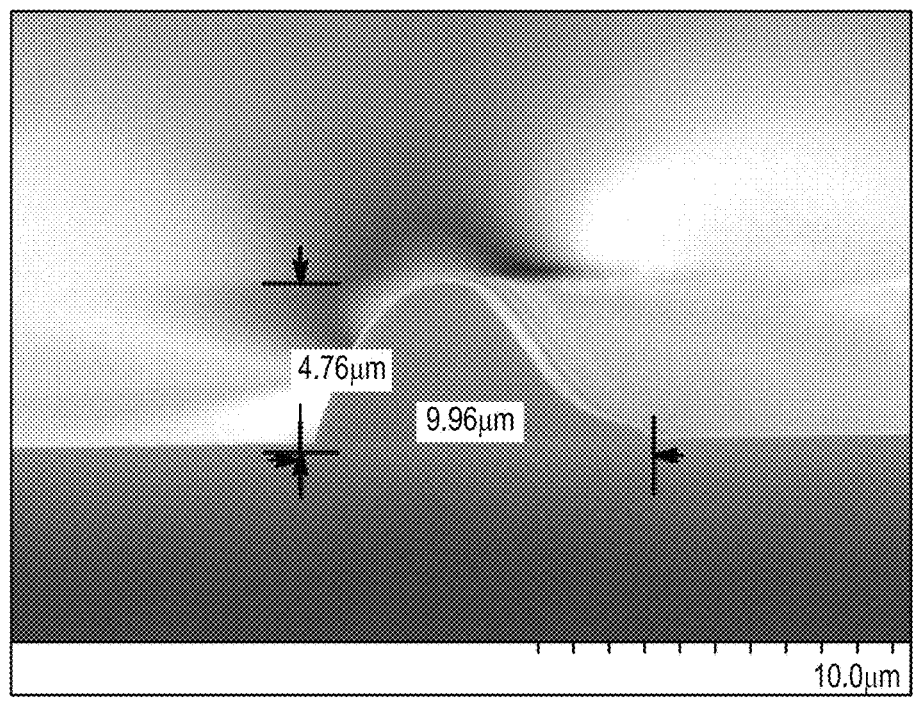
Figure 7E:
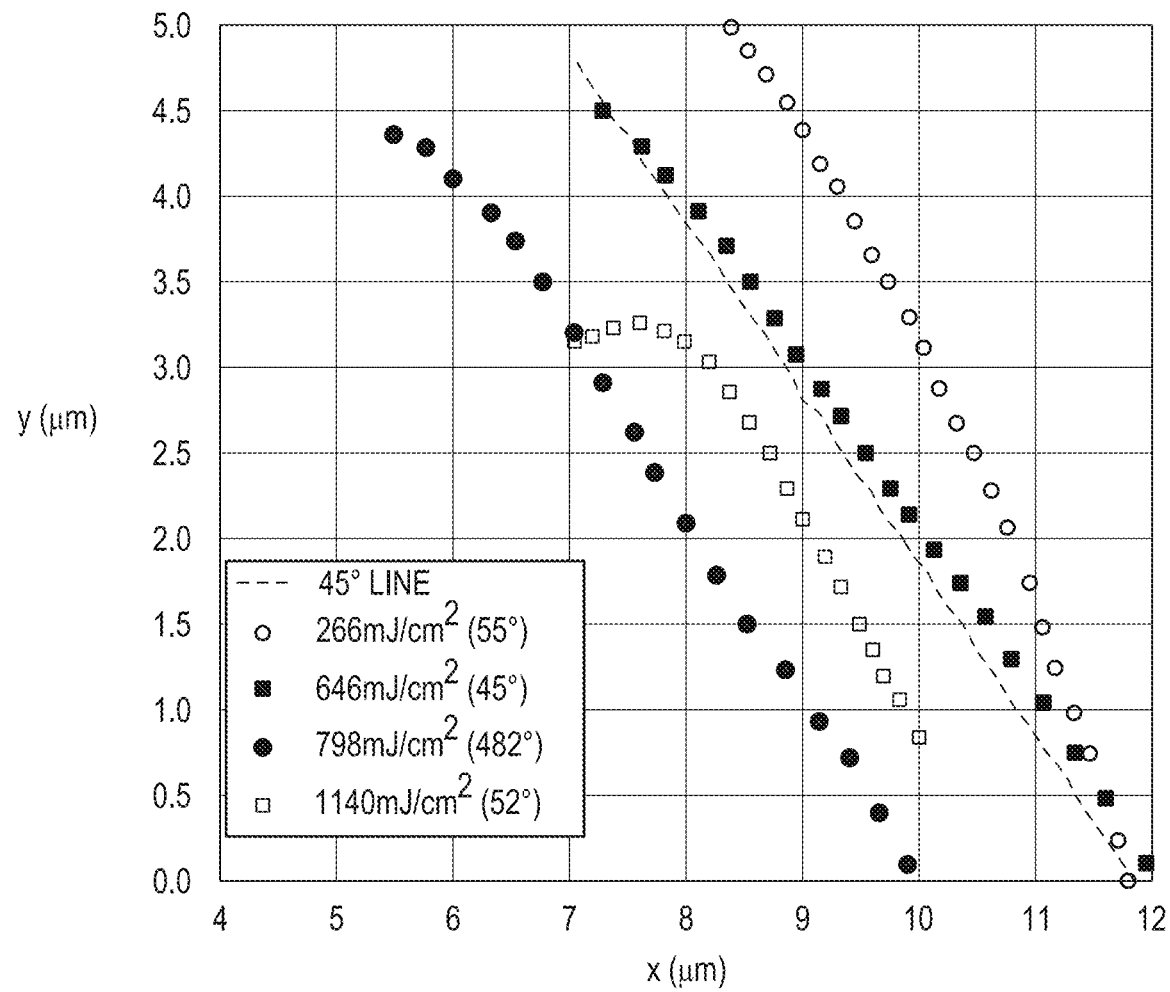
FIG. 7(e) is a plot of the surface topology for each sample.

FIGS. 7(a)-7(d) show cross-sectional SEM images for four different samples. Each sample was scanned at location L=10 μm, which was determined to be the most optimal location from the samples shown in FIG. 6. The dose D was increased for each subsequent sample, from D=266 mJ/cm² in FIG. 7(a) to D=1140 mJ/cm² in FIG. 7(d). The dose was increased by increasing the number N of scans. Thus, FIGS. 7(a)-7(d) show the variation in mirror angle as a function of dose. As shown in FIG. 7(b), a dose of 646 mJ/cm², with N=17, resulted in the desired angle of 45°. On the other hand, as seen in FIGS. 7(a), (c), and (d), when the dose is greater than or less than 646 mJ/cm², the angle is larger than 45 degrees. FIG. 7(d) indicates that as the dose is increased beyond 1100 mJ/cm² the surface takes on a concave shape. For the optimum dose the surface figure is 0.06 μm P-V (0.04 waves RMS for λ=1.55 μm) as summarized in the plot of FIG. 7(e), which also shows a 45 degree reference line.

The results shown in FIG. 7 for selecting the proper dosage to form the mirror surface at the desired angle can be explained in terms of the nonlinearities discussed above. When multiple scans of the laser beam are performed over the mirror blank at the same location (L=10 um), more material is removed where the dose is lower (close to the leftmost portion of the mirror blank), as compared to where the dose is higher (close to the rightmost edge of the mirror blank). Thus, the angle of the mirror surface decreases as the number of passes increases. This tendency continues up to a dose of 646 mJ/cm² (FIG. 7(b)). Beyond this dose level, the angle of the slope once again increases while the height of the mirror surface decreases and the boundary of the mirror starts shifting towards the left. By scanning at the location L=10 μm the nonlinearity of the material removal rate (depicted in FIG. 4b) balances the dose profile (arising from using one side of the Gaussian intensity profile of the laser beam), thereby yielding a mirror surface with a straight slope. As the dose increases further, the optimum condition for L is no longer satisfied since more material is removed from the right edge of the mirror blank, as indicated by the decrease in height and a shift of slope towards the left. Thus, the effective value for L increases to >10 μm for which the angle increases, as observed in FIG. 6(d) for L=11 um.

In FIG. 7(d), the topology of mirror surface looks more concave because of the residual material located at the right edge. The existence of the residual material is due to the mismatch between the nonlinearity of the material removal rate with respect to the nonlinear Gaussian profile of the applied dose. For this case, less material near the right edge of the mirror was removed since a more intense part of the laser beam is no longer matched to the right edge of the mirror blank. In contrast, the left part of the mirror blank is mostly intact but has a steeper angle because this portion is exposed to the tail of the Gaussian intensity profile where there is less variation in intensity compared to the center portion of Gaussian intensity profile.

After formation of the latent image for the mirror surface in the test sample described above by exposing the mirror blank in a flood exposure step and a maskless lithography step (see FIGS. 2b and 2c), the resist was developed using NMD-3 2.38% (TOK, Milpitas, Calif.) for 5 min. Finally, the sample was hard baked using a hot plate for 60 min at 150° C. The mirror surface was then selectively coated with a 100 nm layer of Au by using a lithographic wet etching technique (see FIGS. 2d and 2e).

Figure 2G:
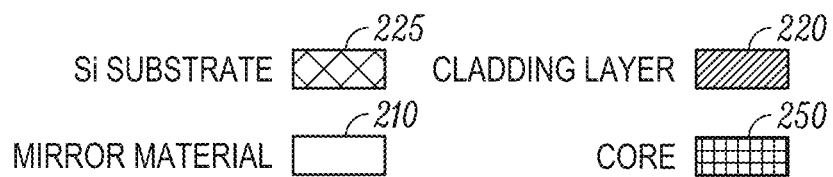
Figure 2G:
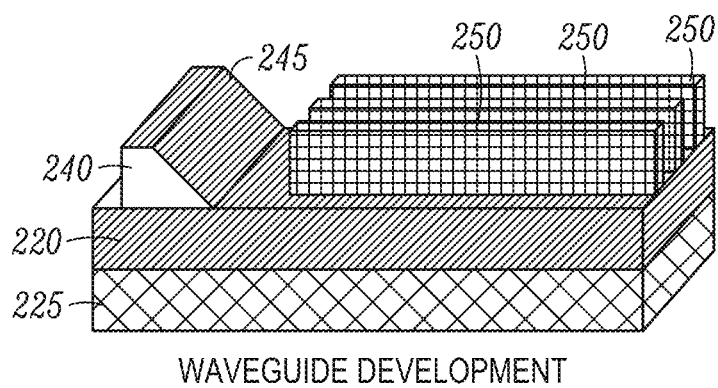
Figure 2H:
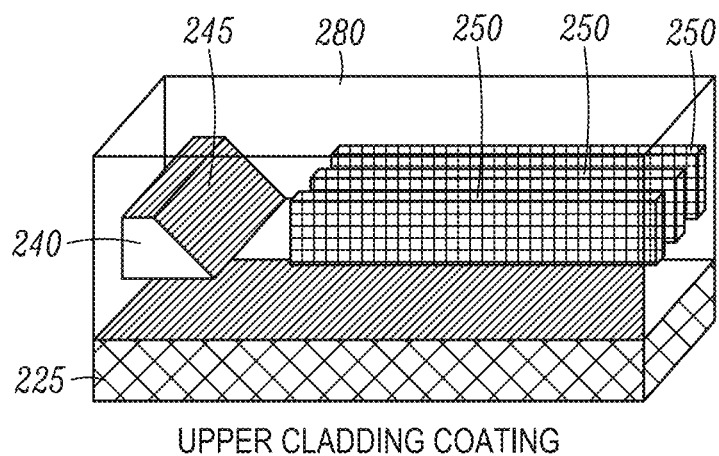

After completion of the mirror surface by selectively coating it with Au, the waveguide cores (s) 250 (FIG. 1) may be formed, as shown in FIGS. 2(e)-2(g). For the test sample this process began by spin coating an 11 μm thick layer of Epocore (Microresist Technology, Berlin, Germany) over the mirror surface and the lower cladding layer 220. The Epocore layer was patterned into the waveguide cores 250 using an exposure dose of 350 mJ/cm$^2$, developed (90 sec bath, SU-8 developer with IPA rinse) and hard baked (90° C. for 5 min on a hot plate) followed by an upper cladding layer of Epoclad.

Figure 8A:
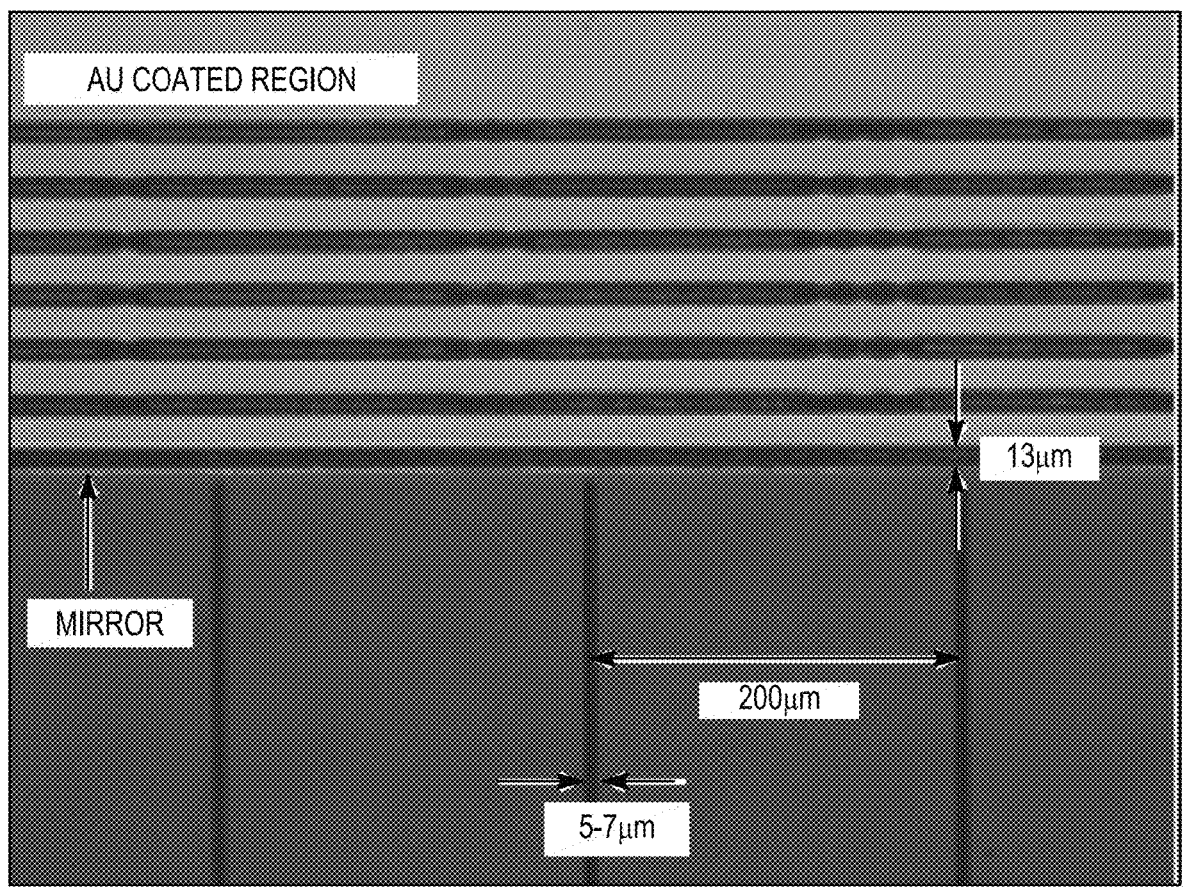
FIG. 8(a) is a top view of an illustrative embodiment of the optical interconnect arrangement showing the Au coated mirror and the array of polymer waveguide cores before the upper cladding layer is applied.
Figure 8B:
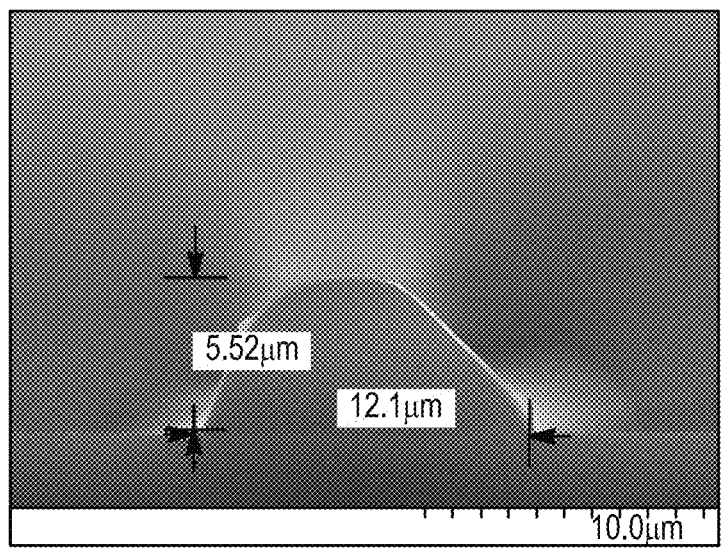
FIG. 8(b) is a cross-sectional SEM of the optical coupler and FIG. 8(c) is a cross-sectional SEM of one of the waveguide cores.
Figure 8C:
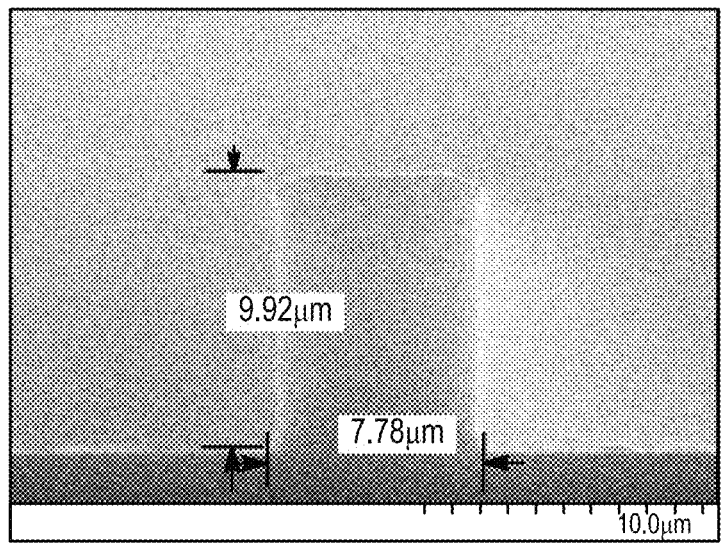
Figure 8D:
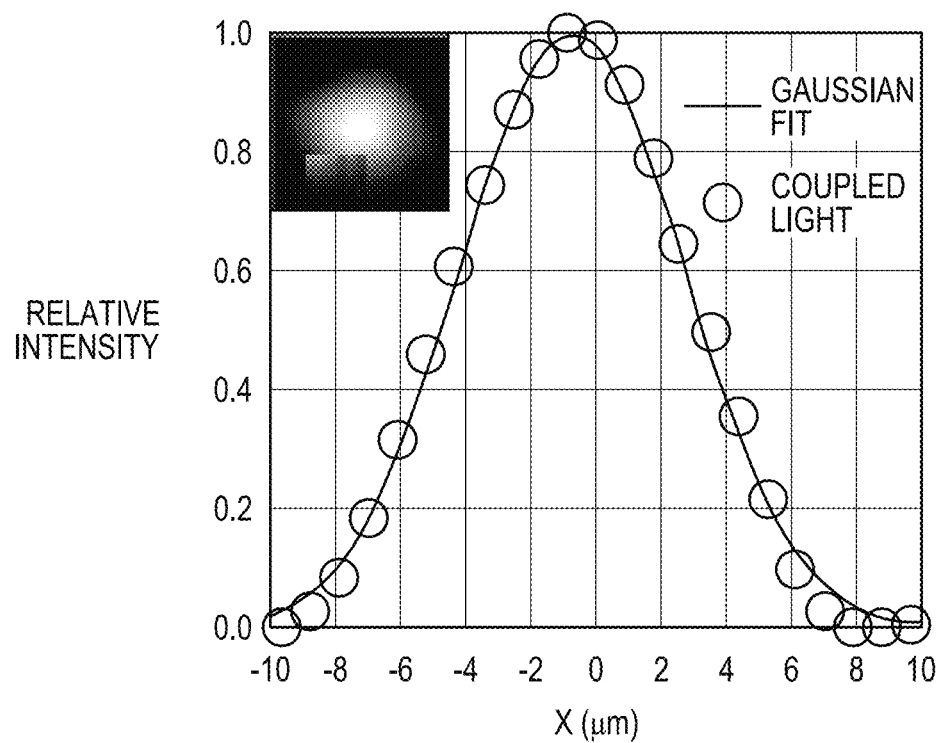
FIG. 8(d) shows the optical output mode from the cleaved edge of one of the waveguides.

FIG. 8(a) is a top view of an illustrative embodiment of the optical interconnect arrangement showing the Au coated mirror and the array of polymer waveguide cores before the upper cladding layer is applied. In addition, a series of alignment stripes are located above the Au coated mirror. These stripes, which are used for alignment purposes only, will be discussed in more detail below. FIG. 8(b) is a cross-sectional SEM of the optical coupler and FIG. 8(c) is a cross-sectional SEM of one of the waveguide cores. FIG. 8(d) shows the optical output mode from the cleaved edge of one of the waveguides, which is obtained by illuminating the other side of the waveguide via the mirror. The optical output is shown fit to a Gaussian curve with a 1/e$^2$ diameter=13.1 μm.

Because two different tools are used in the exposure process, one using a binary mask and the other using a direct write process, the structure is transferred from one tool to another after the latent image of the mirror blank is formed. Therefore, it is important to ensure that the structure is properly aligned after being transferred to the platform of the MLT so that the secondary exposure can be performed at the proper location. For instance, since the dimension of the mirror blank in the test sample was 13 μm×13 μm and the size of the focused spot used for exposure in the direct write process was 2.1 μm, the effect of misalignment can be substantial. The location of the secondary exposure performed with the MLT is important to the final mirror shape and ideally should be determined to accuracy within 1 μm. As explained below, a non-destructive alignment technique that uses the aforementioned alignment stripes may be employed for this purpose.

The alignment technique takes advantage of the change in refractive index that arises in the latent image (the portion of exposed resist which has not been developed yet) defined in the resist. That is, once exposed, the chemical properties of the resist are changed such that there is a slight difference in its index of refraction. This difference can be observed with an alignment camera having sufficient contrast.

Figure 9A:
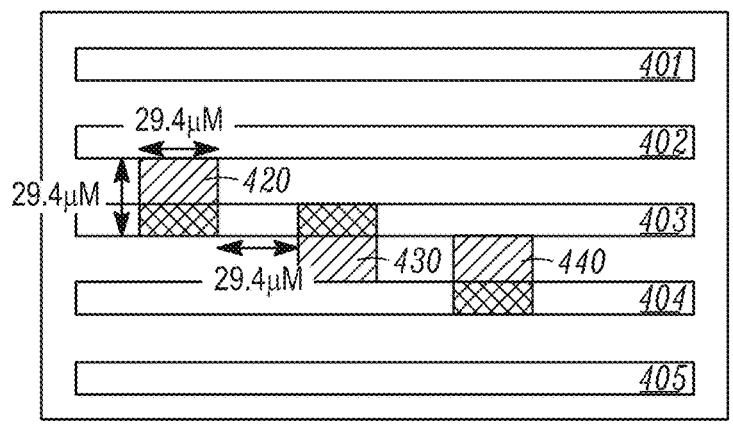
FIG. 9(a) shows a plan view of a sample that includes one mirror blank in which the optical coupler will be formed and four mirror blanks that are used as alignment stripes.

FIG. 9(a) shows a plan view of sample on which five mirror blanks 401, 402, 403, 404 and 405 have been formed. The fifth mirror blank 405 may serve as the actual mirror surface of the optical coupler, while the remaining mirror blanks serve as alignment stripes. After a coarse alignment of the sample has been performed on the MLT using conventional techniques, a set of three squares 420, 430 and 440 are exposed onto the alignment stripes. The additional exposure on top of the already exposed alignment stripes produce a blank space in the stripe. As FIG. 9(a) shows, the squares, which are vertically offset from one another, each have dimensions (e.g., 29.5 μm×29.4 μm) that is equal to the period of the test stripes. The squares are also separated from each other horizontally by this same amount.

Figure 9B:
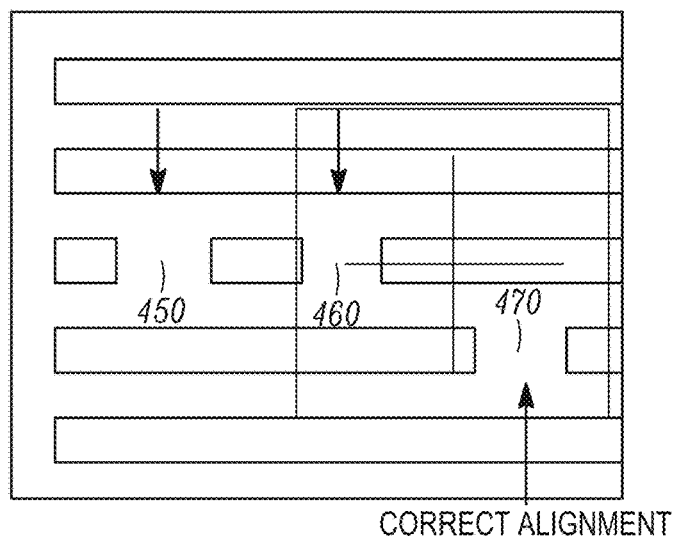
FIG. 9(b) shows a sample in which the alignment stripes and additional alignment squares indicate correct alignment.
Figure 9C:
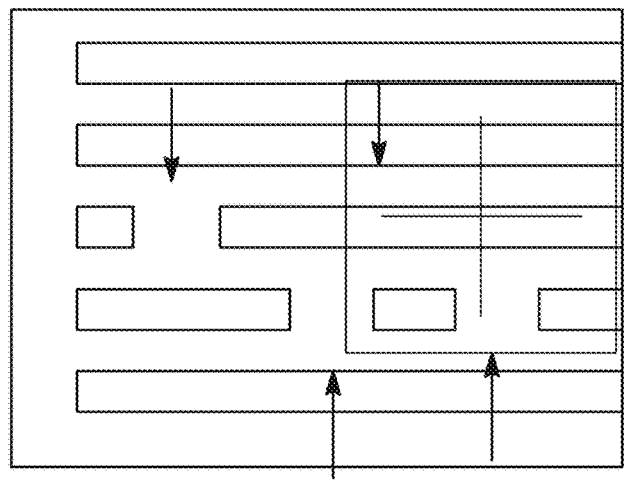
FIG. 9(c) shows a sample in which the alignment stripes and additional alignment squares indicate incorrect alignment

By design, a perfectly aligned image would produce two consecutive blank spaces in the third test stripe 403 and a blank space in the fourth test stripe 404. For example, FIG. 9(a) shows an image with correct alignment and blank spaces 450, 460 and 470. If this order is not observed or if stripes other than the third and the fourth contain blank spaces, the alignment is not correct. The alignment error can be quantified by measuring the location of the blank spaces with respect to the stripes using the alignment camera and the translation stage. For example, while FIG. 9(b) shows an image with correct alignment, FIG. 9(c) shows an image with an incorrect alignment, which occurs when the square pattern is printed too low by one half of a stripe period. This is an extreme example of misalignment, but even fractions of a period can be observed down to a 1 μm accuracy. Both the horizontal and vertical alignment can be assessed using this method.

In some embodiments, such as shown in FIG. 9(a), the length of the alignment stripes is sufficient to accommodate multiple instances of the square pattern. This allows an iterative approach to be used. If the alignment is shown to be off after exposure of the square image, an adjustment can be made to the printing coordinates and another square pattern can be exposed without removing the sample. This allows the alignment to be completed on a single sample without the need for development or SEM. While the examples shown in FIG. 9(a) employs four alignment stripes, in general at least two, and more preferably at least three alignment stripes should be employed. Of course, more than four alignment stripes may be employed as well.

While the test sample described above shows an out-of-plane optical waveguide having particular dimensions (e.g., a height of 5.55 μm), more generally the techniques described herein may be used to fabricate an out-of-plane optical waveguide with different dimensions as well. For instance, in some embodiments a height of 10 μm or more may be desired while maintaining the flat mirror surface at a 45° angle. To accomplish this, the initially deposited positive photoresist layer needs to be thicker than is employed in the test sample. Suitable photoresist materials are available which can be at least 20 μm thick. Also, the intensity profile of the laser beam (a side of Gaussian intensity profile of a focused laser) and the total accumulated dose (number of scans) may need to be increased. Likewise, the 1/e$^2$ width of the laser beam may need to be increased from the value of 2.1 μm that was used to form the test sample. For a thicker film the beam width needs to be increased to take advantage of the same nonlinear resist response over a larger area. The beam width may be increased, for example, by using a lower NA focusing optics (e.g., 0.05 instead of 0.1) or by reducing the beam size with an inverse telescope type optical arrangement while continuing to use a focusing lens with an NA of 0.1. The angle of the mirror surface can be controlled by the number of passes of the laser beam, which will need to be increased since the volume of photoresist to be removed is greater when the optical coupler height is increased.

In some embodiments the waveguide(s) that receive the reflected light from the optical coupler may have an air interface at its upper surface instead of the upper cladding layer described above. That is, the waveguide(s) may have a cladding-core-air configuration instead of a cladding-core-cladding configuration. The former configuration may be advantageous in some cases because it reduces the required height of the optical coupler by pushing the optical mode closer to the substrate. In this way the coupling efficiency of the mirror surface can be improved.

Although the subject matter has been described in language specific to structural features and/or methodological acts, it is to be understood that the subject matter defined in the appended claims is not necessarily limited to the specific features or acts described above. Rather, the specific features and acts described.

The invention claimed is:

1. A lithographic method for making an out-of-plane optical coupler, comprising:
    forming a photoresist layer of positive photoresist material over a substrate;
    flood exposing the positive photoresist layer to light through a binary mask to pattern a latent image of a mirror blank in the photoresist layer, the positive photoresist layer having a nonlinear response to laser power over a range of dosages of laser power such that within that range a nonlinear removal rate arises in which a removal rate of the positive photoresist material increases as an applied dosage of laser power decreases;
    applying controlled dosages to the mirror blank by scanning a laser beam over the latent image of the mirror blank only a plurality of times only along a single scanning line at a single fixed distance from an edge of the mirror blank, the laser beam having an intensity profile within a region that is nonlinear such that within that region the controlled dosage has a controlled nonlinear dosage profile, the scanning balancing the controlled nonlinear dosage profile and the nonlinear removal rate of the positive photoresist material to thereby form a latent image of a planar mirror surface that is oriented at a prescribed non-zero angle to a plane in which the substrate extends; and
    developing the positive photoresist material so that a remaining portion of the developed positive photoresist material forms an out-of-plane optical coupler having a planar mirror surface that is oriented at the prescribed angle.

2. The lithographic method of claim 1, further comprising applying an optically reflective material to the planar mirror surface.

3. The lithographic method of claim 1, further comprising selecting the controlled dosages of light applied at the specified location from a range of dosages over which a removal rate of the positive photoresist material decreases in a nonlinear manner as the dosage increases.

4. The lithographic method of claim 3, wherein the laser beam has a Gaussian intensity profile and scanning the laser beam over the latent image of the mirror blank includes scanning only one side of the Gaussian intensity profile of the laser beam over the latent image of the mirror blank.

5. The lithographic method of claim 1, wherein the prescribed angle is a 45° angle.

6. The lithographic method of claim 1, wherein forming the positive photoresist layer includes forming the positive photoresist layer on a lower cladding layer disposed on the substrate.

7. The lithographic method of claim 1, further comprising:
    applying a second photoresist layer over the out-of-plane optical coupler and an exposed portion of the lower cladding layer;
    exposing the second photoresist layer to light through a second mask to pattern a latent image of at least one waveguide core in the second photoresist layer; and
    developing the second photoresist layer to form the at least one waveguide.

8. The lithographic method of claim 7, wherein the at least one waveguide is oriented to receive light reflected by the planar mirror surface.

9. The lithographic method of claim 8, further comprising forming an upper cladding layer over the at least one waveguide and the out-of-plane optical coupler.

10. The lithographic method of claim 1, wherein scanning the laser beam over the latent image of the mirror blank includes scanning the laser beam over the latent image of the mirror blank using a direct writing tool having a numerical aperture of 0.1 or less.

* * * * *